(12) United States Patent
Pagaila et al.

(10) Patent No.: US 9,343,429 B2
(45) Date of Patent: May 17, 2016

(54) SEMICONDUCTOR DEVICE AND METHOD OF FORMING DOUBLE-SIDED THROUGH VIAS IN SAW STREETS

(75) Inventors: Reza A. Pagaila, Singapore (SG); Byung Tai Do, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 1534 days.

(21) Appl. No.: 12/683,008

(22) Filed: Jan. 6, 2010

(65) Prior Publication Data
US 2010/0102456 A1    Apr. 29, 2010

Related U.S. Application Data

(62) Division of application No. 12/127,357, filed on May 27, 2008, now Pat. No. 7,666,711.

(51) Int. Cl.
*H01L 23/544* (2006.01)
*H01L 25/065* (2006.01)
(Continued)

(52) U.S. Cl.
CPC .......... *H01L 25/0657* (2013.01); *H01L 21/561* (2013.01); *H01L 21/568* (2013.01); *H01L 23/3107* (2013.01); *H01L 24/18* (2013.01); *H01L 25/03* (2013.01); *H01L 23/481* (2013.01); *H01L 24/48* (2013.01); *H01L 2224/18* (2013.01); *H01L 2224/48091* (2013.01); *H01L 2224/48145* (2013.01); *H01L 2225/0651* (2013.01); *H01L 2225/06506* (2013.01); *H01L 2225/06551* (2013.01); *H01L 2924/0103* (2013.01); *H01L 2924/01006* (2013.01); *H01L 2924/01013* (2013.01); *H01L 2924/01023* (2013.01); *H01L 2924/01029* (2013.01);
(Continued)

(58) Field of Classification Search
CPC ............ H01L 21/302; H01L 21/76898; H01L 2221/68359; H01L 2224/16145; H01L 2224/32145; H01L 2224/32225; H01L 2225/06555; H01L 23/481; H01L 23/49827; H01L 23/52; H01L 25/0657; H01L 27/1262
USPC ......... 257/72, 74, 75, 620, E21.238, E23.141
See application file for complete search history.

(56) References Cited

U.S. PATENT DOCUMENTS 5,729,437 A    3/1998    Hashimoto
6,243,945 B1   6/2001    Fujimoto et al.
(Continued)

FOREIGN PATENT DOCUMENTS

JP    2001-298118    10/2001

*Primary Examiner* — Jerome Jackson, Jr.
*Assistant Examiner* — Joannie A Garcia
(74) *Attorney, Agent, or Firm* — Robert D. Atkins; Patent Law Group: Atkins and Associates, P.C.

(57) ABSTRACT

A semiconductor device is made by creating a gap between semiconductor die on a wafer. An insulating material is deposited in the gap. A first portion of the insulating material is removed from a first side of the semiconductor wafer to form a first notch. The first notch is less than a thickness of the semiconductor die. A conductive material is deposited into the first notch to form a first portion of the conductive via within the gap. A second portion of the insulating material is removed from a second side of the semiconductor wafer to form a second notch. The second notch extends through the insulating material to the first notch. A conductive material is deposited into the second notch to form a second portion of the conductive via within the gap. The semiconductor wafer is singulated through the gap to separate the semiconductor die.

12 Claims, 10 Drawing Sheets

(51) Int. Cl.
  *H01L 21/56* (2006.01)
  *H01L 23/31* (2006.01)
  *H01L 23/00* (2006.01)
  *H01L 25/03* (2006.01)
  *H01L 23/48* (2006.01)

(52) U.S. Cl.
  CPC ........... *H01L 2924/01033* (2013.01); *H01L 2924/01047* (2013.01); *H01L 2924/01078* (2013.01); *H01L 2924/01079* (2013.01); *H01L 2924/01082* (2013.01); *H01L 2924/01322* (2013.01); *H01L 2924/12044* (2013.01); *H01L 2924/14* (2013.01); *H01L 2924/1433* (2013.01); *H01L 2924/181* (2013.01); *H01L 2924/19041* (2013.01)

(56) References Cited

U.S. PATENT DOCUMENTS

| | | | |
|---|---|---|---|
| 6,455,945 B1 * | 9/2002 | Ishii et al. | 257/797 |
| 6,831,367 B2 | 12/2004 | Sekine | |
| 6,908,856 B2 | 6/2005 | Beyne et al. | |
| 7,504,722 B2 * | 3/2009 | Ochiai | 257/730 |
| 7,905,012 B2 * | 3/2011 | Kuwajima et al. | 29/847 |
| 2006/0118510 A1 | 6/2006 | Fujii | |
| 2007/0262464 A1 | 11/2007 | Watkins et al. | |
| 2008/0096321 A1 | 4/2008 | Lin et al. | |
| 2008/0174006 A1 | 7/2008 | Fuchinoue | |
| 2008/0194060 A1 | 8/2008 | Shimanuki | |
| 2008/0277793 A1 | 11/2008 | Noma et al. | |
| 2009/0001396 A1 * | 1/2009 | Higaki et al. | 257/98 |
| 2010/0164086 A1 * | 7/2010 | Noma et al. | 257/686 |

* cited by examiner

SEMICONDUCTOR DEVICE AND METHOD OF FORMING DOUBLE-SIDED THROUGH VIAS IN SAW STREETS

CLAIM TO DOMESTIC PRIORITY

The present application is a division of U.S. patent application Ser. No. 12/127,357, filed May 27, 2008, and claims priority to the foregoing parent application pursuant to 35 U.S.C. §120.

FIELD OF THE INVENTION

The present invention relates in general to semiconductor devices and, more particularly, to a semiconductor device having double-sided through vias formed in the saw street.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die face down toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads, which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In many applications, it is desirable to vertically stack semiconductor die for greater device integration and minimize interconnect routing. The electrical interconnection between stacked semiconductor die has been done by using through hole vias which traverse from a front side to the backside of the die. The through hole vias are formed by drilling through the active area of the die or through saw streets on the wafer prior to any dicing operation. The through hole vias are filled with conductive material. The process of drilling through hole vias in the active area of the die or in saw streets on the wafer can cause damage to the wafer and/or die.

The demand for more device functionality and higher integration requires more input and output (I/O) capability. As the number of interconnect pads increases, the number of vias in the saw street must correspondingly increase. At certain aspect ratios, the via filling process may encounter incomplete via filling. Voids can be formed within the vias, causing reliability problems and reduced electrical performance of the semiconductor device. The voiding problem limits aspect ratios that can be achieved for the conductive vias and correspondingly the interconnect density.

SUMMARY OF THE INVENTION

A need exists to interconnect stacked semiconductor die with a conductive via having a high aspect ratio and no void within the conductive via. Accordingly, in one embodiment, the present invention is a semiconductor device comprising a semiconductor die having a contact pad. An insulating material is formed around the semiconductor die. A first portion of the insulating material is removed from a first side of the semiconductor die to form a first notch that is less than a thickness of the semiconductor die, and a second portion of the insulating material is removed from a second side of the semiconductor die opposite the first side of the semiconductor die to form a second notch extending through the insulating material to the first notch. A first conductive material is deposited into the first notch to form a first portion of the conductive via in the insulating material. A second conductive material is deposited into the second notch to form a second portion of the conductive via in the insulating material. A conductive layer is formed over the semiconductor die and insulating layer to electrically connect the contact pad and conductive via.

In another embodiment, the present invention is a semiconductor device comprising a semiconductor die and insulating material deposited around the semiconductor die. A first portion of the insulating material is removed from a first side of the semiconductor die to form a first notch that is less than a thickness of the semiconductor die, and a second portion of the insulating material is removed from a second side of the semiconductor die opposite the first side of the semiconductor die to form a second notch extending through the insulating material to the first notch. A first conductive material is deposited into the first notch to form a first portion of the conductive via in the insulating material. A second conductive material is deposited into the second notch to form a second portion of the conductive via in the insulating material.

In another embodiment, the present invention is a semiconductor device comprising a plurality of semiconductor die and insulating material formed between the semiconductor die. A first portion of the insulating material is removed from a first side of the semiconductor die to form a first notch that is less than a thickness of the semiconductor die, and a second portion of the insulating material is removed from a second side of the semiconductor die opposite the first side of the semiconductor die to form a second notch. A conductive material is deposited into the first notch and second notch to form a conductive via in the insulating material.

In another embodiment, the present invention is a semiconductor device comprising a semiconductor die having a peripheral region filled with an insulating material. A double-sided conductive via is formed in the insulating material in the peripheral region. The double-sided conductive via has first and second portions formed through opposite sides of the semiconductor die.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
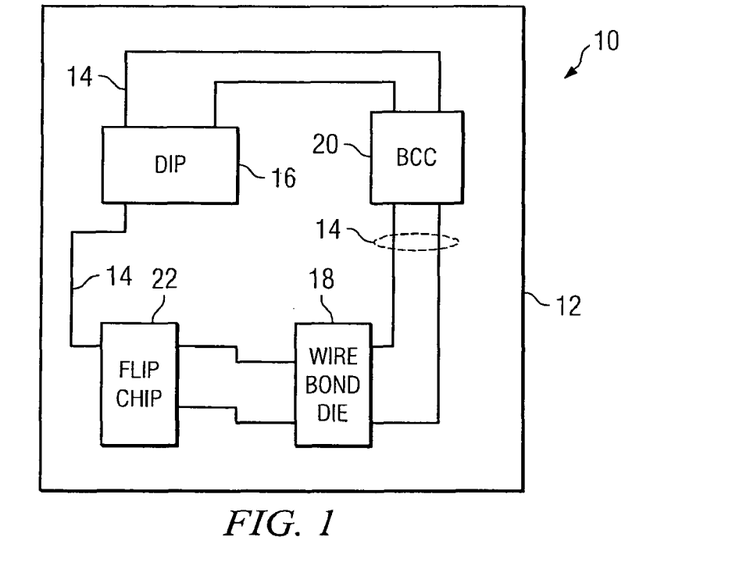
FIG. 1 illustrates a PCB with different types of packages mounted to its surface.

FIG. 1 illustrates electronic device 10 having a chip carrier substrate or printed circuit board (PCB) 12 with a plurality of semiconductor packages or semiconductor die mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, radio frequency (RF) circuits, discrete devices, or other semiconductor die or electrical components.

In FIG. 1, PCB 12 provides a general substrate for structural support and electrical interconnect of the semiconductor packages and other electronic components mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and any connected external system components. Traces 14 also provide power and ground connections to each of the semiconductor packages.

For the purpose of illustration, several types of semiconductor packages, including a dual in-line package (DIP) 16, wire-bonded die 18, bump chip carrier (BCC) 20, and flip-chip package 22, are shown mounted on PCB 12. Depending upon the system requirements, any combination of semiconductor packages or other electronic components can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality and represent known good units (KGUs), electronic devices can be manufactured using cheaper components and shorten manufacturing process. The resulting devices are less likely to fail and less expensive to manufacture resulting in lower costs for consumers.

Figure 2A:
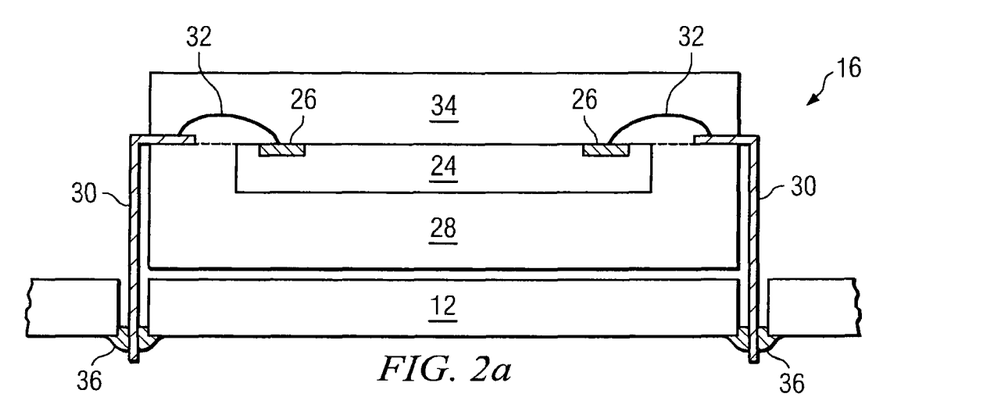
FIGS. 2a-2d illustrates further detail of the semiconductor packages mounted to the PCB.

FIG. 2a illustrates further detail of DIP 16 mounted on PCB 12. DIP 16 includes semiconductor die 24 having contact pads 26. Semiconductor die 24 includes an active area containing analog or digital circuits implemented as active devices, passive devices, conductive layers, and dielectric layers formed within semiconductor die 24 and are electrically interconnected according to the electrical design of the die. For example, the circuit may include one or more transistors, diodes, inductors, capacitors, resistors, and other circuit elements formed within the active area of die 24. Contact pads 26 are made with a conductive material such as aluminum (Al), copper (Cu), tin (Sn), nickel (Ni), gold (Au), or silver (Ag), and are electrically connected to the circuit elements formed within die 24. Contact pads 26 are formed by a physical vapor deposition (PVD), chemical vapor deposition (CVD), electrolytic plating, or electroless plating process. During assembly of DIP 16, semiconductor die 24 is mounted to a die attach area of lower portion 28 of the package body using a gold-silicon eutectic layer or adhesive material, such as thermal epoxy. The package body includes an insulative packaging material such as plastic or ceramic. Conductor leads 30 are connected to lower portion 28 of the body and wirebonds 32 are formed between leads 30 and contact pads 26 of die 24. Encapsulant 34 is deposited over the package for environmental protection by preventing moisture and particles from entering the package and contaminating die 24, contact pads 26, or wirebonds 32. DIP 16 is connected to PCB 12 by inserting leads 30 into holes formed through PCB 12. Solder material 36 is flowed around leads 30 and into the holes to physically and electrically connect DIP 16 to PCB 12. Solder material 36 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high lead, or lead free.

Figure 2B:
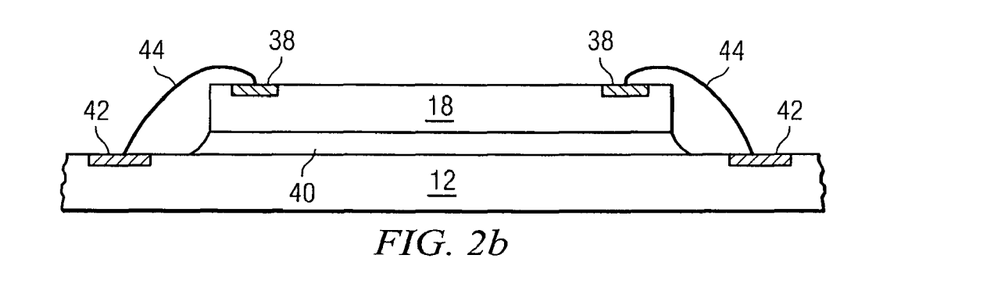

Referring to FIG. 2b, a wire bonded die 18 having contact pads 38 is mounted to PCB 12 using adhesive 40. Contact pads 42 are formed on the surface of PCB 12 and electrically connect to one or more traces 14 formed on or within the layers of PCB 12. Wirebonds 44 are formed between contact pads 38 of die 18 and contact pads 42 of PCB 12.

Figure 2C:
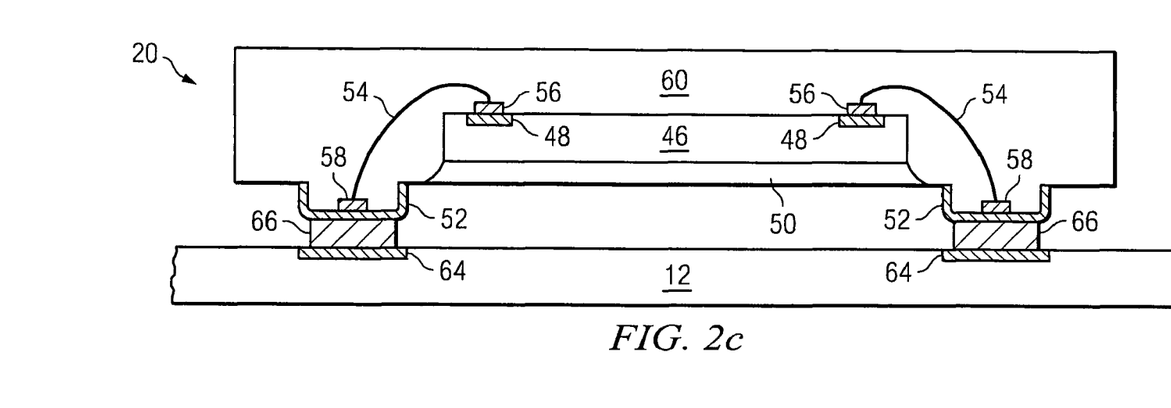

FIG. 2c illustrates further detail of BCC 20 with an incorporated semiconductor die, integrated circuit (IC), or combination thereof. Semiconductor die 46 having contact pads 48 is mounted over a carrier using an underfill or epoxy-resin adhesive 50. Semiconductor die 46 includes an active area containing analog or digital circuits implemented as active devices, passive devices, conductive layers, and dielectric layers formed within semiconductor die 46 and are electrically interconnected according to the electrical design of the die. For example, the circuit may include one or more transistors, diodes, inductors, capacitors, resistors, and other circuit elements formed within the active area of die 46. Contact pads 48 are connected to the electrical devices and circuitry formed within the active area of die 46. Wirebonds 54 and bond pads 56 and 58 electrically connect contact pads 48 of die 46 to contact pads 52 of BCC 20. Mold compound or encapsulant 60 is deposited over die 46, wirebonds 54 and contact pads 52 to provide physical support and electrical insulation for the device. Contact pads 64 are formed on PCB 12 and electrically connect to one or more conductive signal traces 14. Solder material is deposited between contact pads 52 of BCC 20 and contact pads 64 of PCB 12. The solder material is reflowed to form bumps 66 which form a mechanical and electrical connection between BCC 20 and PCB 12.

Figure 2D:
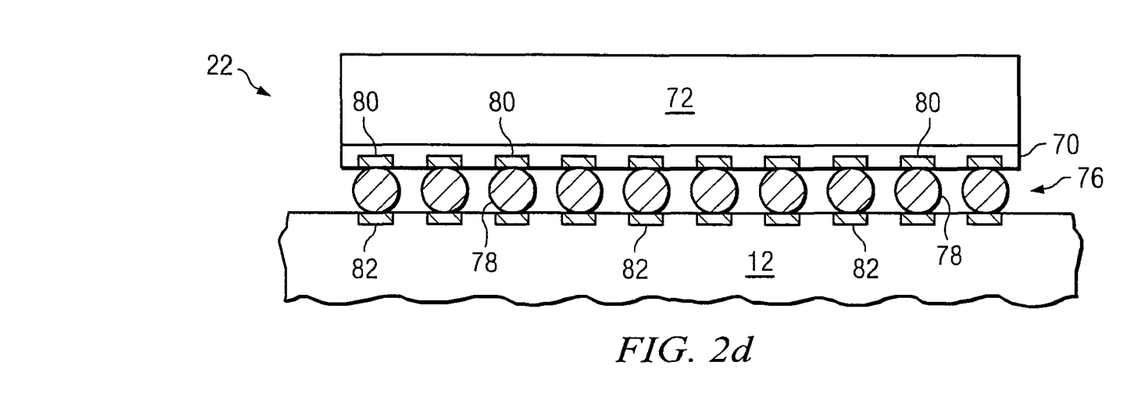

In FIG. 2d, flip chip style semiconductor device 22 has a semiconductor die 72 with active area 70 mounted face down toward PCB 12. Active area 70 containing analog or digital circuits implemented as active devices, passive devices, conductive layers, and dielectric layers formed within semiconductor die 72 is electrically interconnected according to the electrical design of the die. For example, the circuit may include one or more transistors, diodes, inductors, capacitors, resistors, and other circuit elements formed within active area 70 of die 72. The electrical and mechanical interconnect is achieved through solder bump structure 76 comprising a large number of individual conductive solder bumps or balls 78. The solder bumps are formed on bump pads or interconnect sites 80, which are disposed on active area 70. The bump pads 80 connect to the active circuits by conduction tracks in active area 70. The solder bumps 78 are electrically and mechanically connected to contact pads or interconnect sites 82 on PCB 12 by a solder reflow process. The interconnect sites 82 are electrically connected to one or more conductive signal traces 14 on PCB 12. The flip chip semiconductor device provides a short electrical conduction path from the active devices on die 72 to conduction tracks on PCB 12 in order to reduce signal propagation distance, lower capacitance, and achieve overall better circuit performance.

Figure 3A:
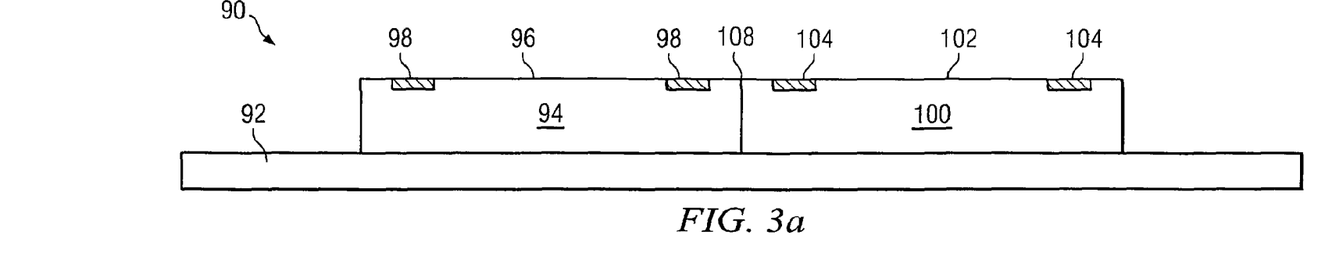
FIGS. 3a-3i illustrate a process of forming double-sided conductive vias in the saw street around a periphery of the die.

FIGS. 3a-3i illustrate a process of forming double-sided conductive vias on a periphery of a semiconductor die in a wafer level chip scale package (WLCSP). To start the process, a plurality of semiconductor die is formed on a semiconductor wafer 90 using conventional integrated circuit processes, as described above. The semiconductor wafer containing semiconductor die 94 and 100 is mounted to expansion table 92 with ultraviolet (UV) tape, as shown in FIG. 3a. The backside of semiconductor die 94 is affixed to expansion table 92 with its active surface 96 and contact pads 98 oriented face up. Likewise, the backside of semiconductor die 100 is mounted to expansion table 92 with its active surface 102 and contact pads 104 oriented face up. Contact pads 98 and 104 electrically connect to active and passive devices and signal traces in active areas 96 and 102 of semiconductor die 94 and 100, respectively.

Figure 3B:
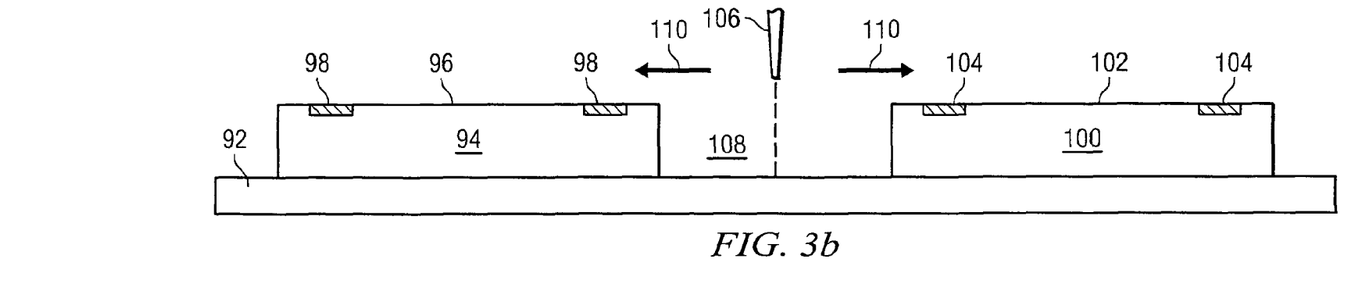

In FIG. 3b, a saw blade or laser tool 106 cuts through saw street 108 of semiconductor die 94 and 102 in a dicing operation. Expansion table 92 moves in two-dimension lateral directions, as shown by arrows 110, to expand the width of saw street 108, i.e., form a gap and create a greater physical separation between the die. Expansion table 92 moves substantially the same distance in the x-axis and y-axis to provide equal separation around a periphery of each die. The post-expansion width of saw street or gap 108 ranges from 5 micrometers (μm) to 200 μm. The expanded dimension depends on the design embodiment, i.e., half-via, full-via, single row via, or double/multiple row via. The expanded saw street or gap 108 defines a peripheral region around the semiconductor die.

In an alternate embodiment, the semiconductor wafer is diced to separate the semiconductor die. The individual semiconductor die are then transferred and affixed to a temporary chip carrier with an adhesive layer, e.g., thermal epoxy. The semiconductor die are placed on the chip carrier so as to have a predetermined separation gap. In general, the separation gap has sufficient width to form conductive vias within the gap, as described below.

Figure 3C:
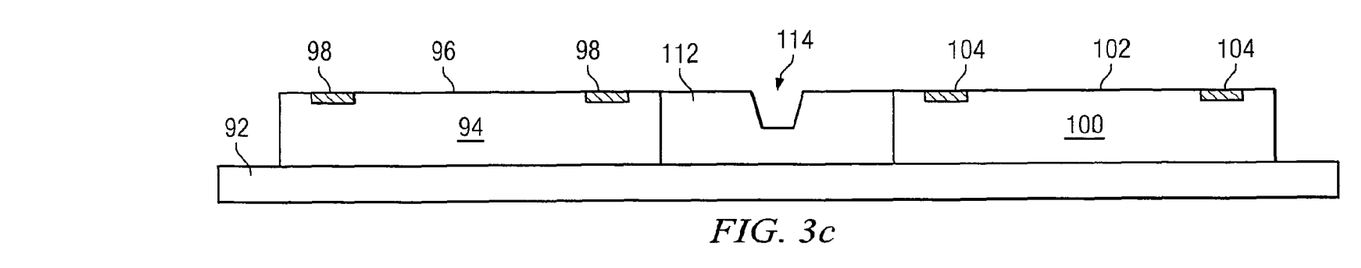

In FIG. 3c, an organic insulating material 112 is deposited in gap 108 using spin coating, needle dispensing, or other suitable application process. Organic material 112 can be benzocyclobutene (BCB), polyimide (PI), or acrylic resin. Alternatively, other non-conductive materials such as a polymer molding compound, liquid epoxy molding, compression molding, soft laminating film, or other material having dielectric or electrical insulating properties can be deposited in gap 108. The non-conductive materials can also be deposited using a transfer molding or injection molding process.

After deposition of organic material 112, the semiconductor die can be removed from the chip carrier and then mounted onto a second carrier.

A portion of organic material 112 is removed from a first side of the semiconductor wafer by laser drilling or etching to create blind hole or notch 114 having a depth less than a thickness of semiconductor die 94 and 100. In one embodiment, notch 114 extends about halfway through the organic material, as shown in FIG. 3c. The walls of the remaining portion of organic material 112, which define notch 114, can be vertical or tapered.

Figure 3D:
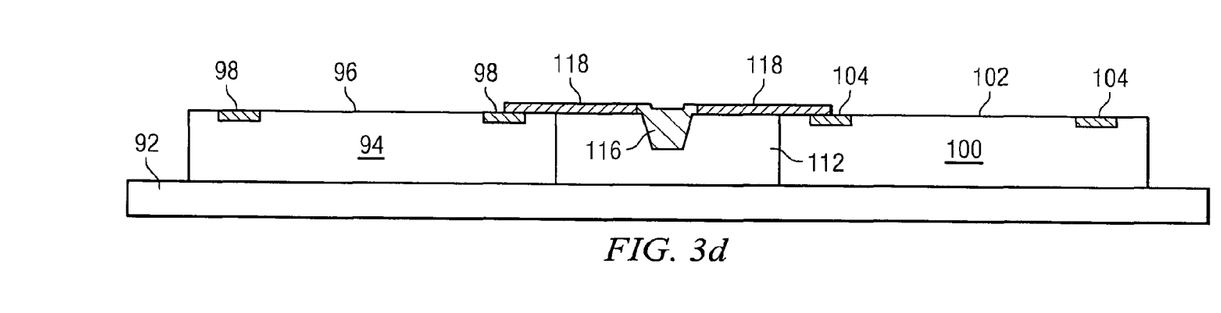

In FIG. 3d, an electrically conductive material 116 is conformally deposited in notch 114 with an optional seed layer. Conductive material 116 can be Al, Cu, Sn, Ni, Au, or Ag. The seed layer can be made with Cu, Ni, nickel vanadium (NiV), Au, or Al. The seed layer and conductive material 116 are patterned and deposited using a conformal electrolytic plating, electroless plating, or other suitable metal deposition process.

An electrically conductive material 118 is patterned and deposited on active surface 96 of semiconductor die 94 and active surface 102 of semiconductor die 100, as well as organic material 112, using an evaporation, electrolytic plating, electroless plating, screen printing, or other suitable metal deposition process. The conductive layer 118 can be made with Al, Cu, Sn, Ni, Au, Ag, or other suitable material. The conductive layer 118 extends from contact pads 98 and 104 to conductive material 116.

Figure 3E:
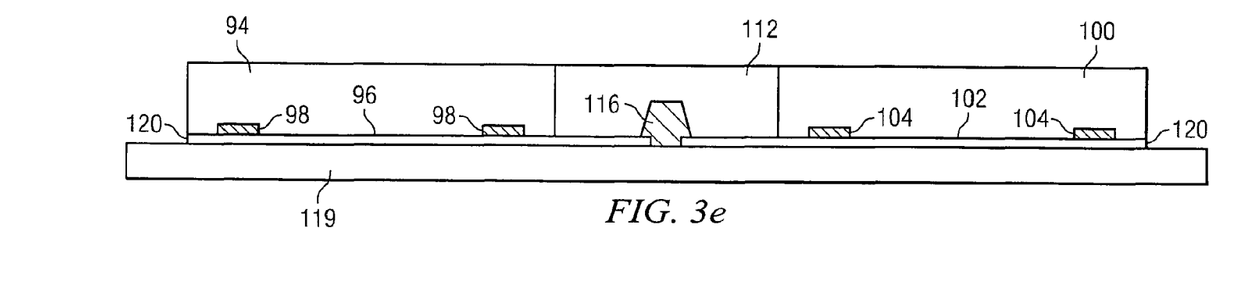

The assembly described in FIGS. 3a-3d is removed from expansion table 92. In FIG. 3e, the assembly is inverted and mounted active surface down to carrier 119 using adhesive 120, such as a thermal epoxy material.

Figure 3F:
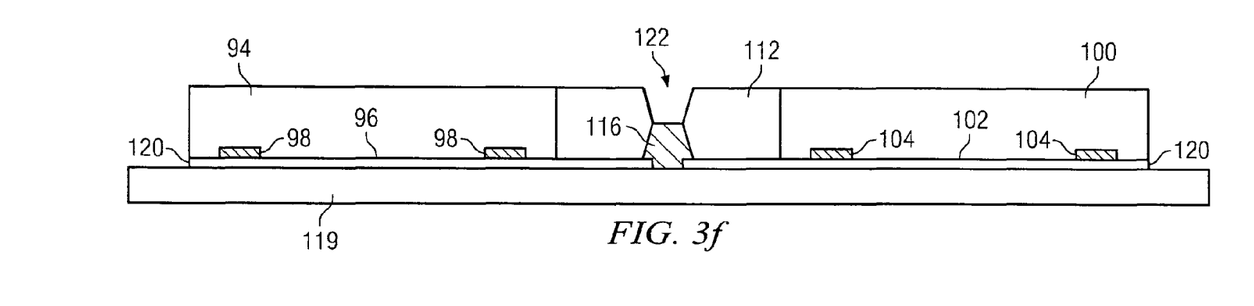

Another portion of organic material 112 is removed from a second side of the semiconductor wafer opposite the first side of the semiconductor wafer, i.e., directly opposite notch 114, by laser drilling or etching to create blind hole or notch 122 extending through the organic material to conductive material 116, as shown in FIG. 3f. The walls of the remaining portion of organic material 112, which define notch 122, can be vertical or tapered.

Figure 3G:
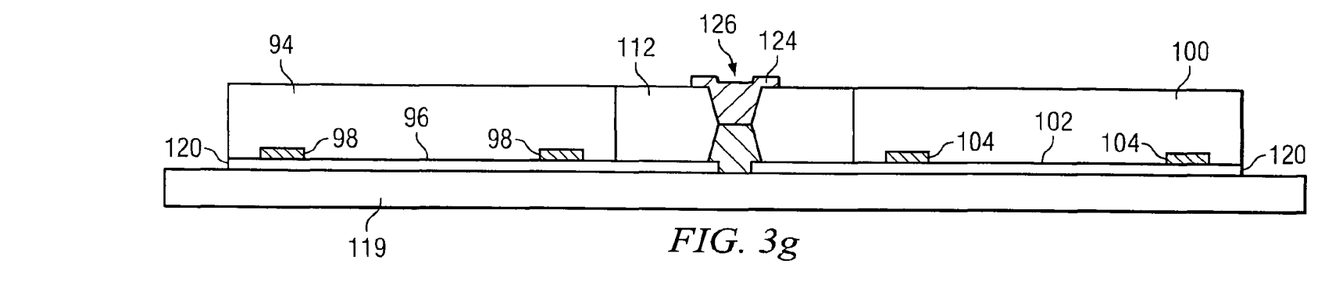

In FIG. 3g, an electrically conductive material 124 is conformally deposited in notch 122 with an optional seed layer. Conductive material 124 can be Al, Cu, Sn, Ni, Au, or Ag. The seed layer can be made with Cu, Ni, NiV, Au, or Al. The seed layer and conductive material 124 are patterned and deposited using a conformal electrolytic plating, electroless plating, or other suitable metal deposition process. Conductive material 124 electrically connects to conductive material 116. The combination of conductive materials 116 and 124 constitute a double-sided conductive via 126 formed through expanded gap 108 in organic material 112 around a peripheral region of the semiconductor die. The double-sided conductive via 126 extends through the semiconductor wafer and creates a signal conduction path from one side of the semiconductor die to the other side of the semiconductor die.

Figure 3H:
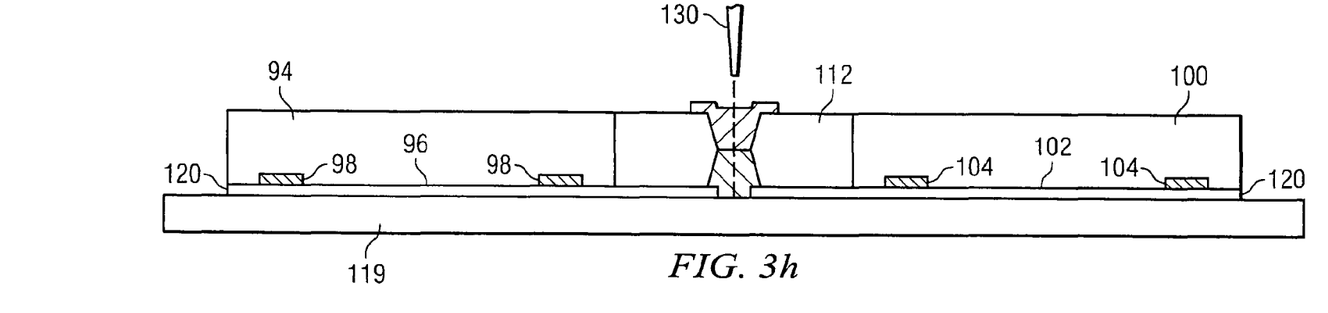

Semiconductor die 94 and 100 are singulated in FIG. 3h through a center portion of gap 108, i.e., through a center portion of notches 114 and 122 to bisect conductive materials 116 and 124 and create conductive half-vias. The saw street or gap region is cut by a cutting tool 130 such as a saw blade or laser. The cutting tool completely severs the gap region to separate the die. The semiconductor die are removed from carrier 119. Each semiconductor die has a similar final configuration.

Figure 3I:
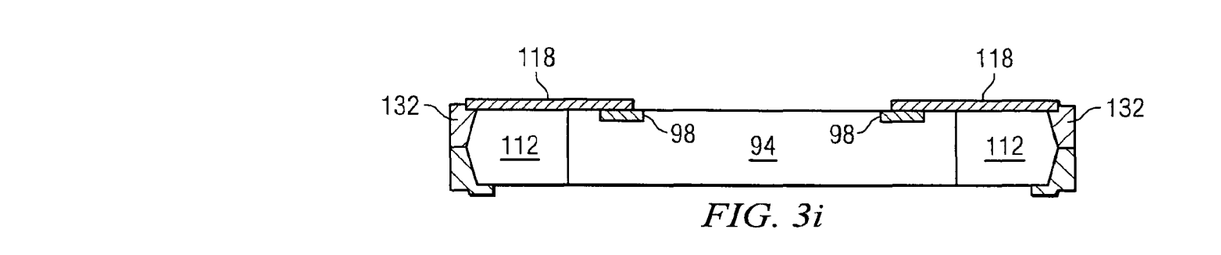

FIG. 3i shows semiconductor die 94 with double-sided conductive half-vias 132 formed in gap 108 and separated from the die by organic material 112. The conductive half-vias are double-sided in that a first portion is formed from a first side of the semiconductor die and a second portion is formed from a second side of the semiconductor die, opposite the first side. The first and second portions of the conductive half-vias 132 are electrically mated to provide a signal conduction path from one side of the semiconductor die to the other side of the semiconductor die. The double-sided conductive half-vias 132 provide for efficient and compact electrical interconnect by direct via metal bonding when stacking semiconductor die within a semiconductor package.

Figure 4:
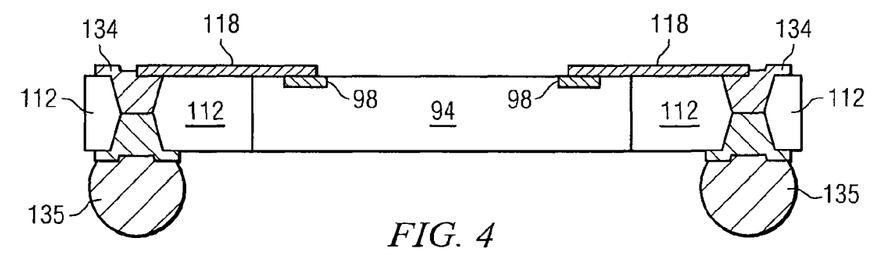
FIG. 4 illustrates the semiconductor die with double-sided conductive full-vias.

FIG. 4 shows semiconductor die 94 with double-sided conductive full-vias 134, surrounded by organic material 112. To form full-vias 134, gap 108 is made sufficiently wide to form two side-by-side blind holes or notches like 114 in FIG. 3c on one side of die 94. The gap is filled with organic material 112. The two notches 114 are separated by organic material 112 in gap 108. Both notches 114 are filled with conductive material as described in FIG. 3d. Likewise, two opposing side-by-side blind holes or notches like 122 in FIG. 3e are formed on the opposite side of die 98. The two notches 122 are separated by organic material 112 in gap 108. Again, both notches 122 are filled with conductive material to electrically contact the conductive material in the respective opposing notches 114. As a result, two side-by-side, double-sided conductive vias are formed in gap 108, each surrounded by organic material 112. In one embodiment, gap 108 is made sufficiently wide to accommodate two double-sided conductive vias within the gap. The cutting tool 130 severs organic material 112 between the two double-sided conductive vias to provide full-vias 134. The conductive full-vias 134 are electrically connected to contact pads 98 by way of conductive layer 118.

In one embodiment, an electrically conductive solder material is deposited over one side of conductive full-via 134 using an evaporation, electrolytic plating, electroless plating, ball drop, or screen printing process. The solder material can be any metal or electrically conductive material, e.g., Sn, Pb, Ni, Au, Ag, Cu, Bi, and alloys thereof. For example, the solder material can be eutectic Sn/Pb, high lead, or lead free. The solder material is reflowed by heating the solder material above its melting point to form solder bumps 135. In some applications, solder bumps 135 are reflowed a second time to improve its electrical contact. The semiconductor die also supports other interconnect structures including micro bumps, solder balls, anisotropic conductive film (ACF), conductive adhesives, and solder paste within the semiconductor package.

Figure 5:
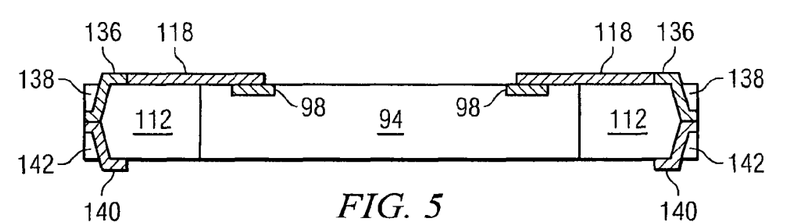
FIG. 5 illustrates the semiconductor die with conformal double-sided conductive half-vias.

In the embodiment of FIG. 5, the assembly is formed as described in FIGS. 3a-3c, i.e., the semiconductor die are separated on the expansion table to form a gap. The gap is filled with organic material 112 and notch like 114 is cut into the organic material. The walls of the remaining portion of organic material 112, which define notch 114, can be vertical or tapered. An electrically conductive lining 136 is conformally deposited along the walls of the remaining portion of organic material 112 in notch 114. Conductive lining 136 includes an optional seed layer. The seed layer and conductive lining 136 are patterned and deposited using a conformal electrolytic plating, electroless plating, or other suitable metal deposition process. The seed layer can be made with Cu, Ni, NiV, Au, or Al. The conductive lining 136 can be made with Al, Cu, Sn, Ni, Au, or Ag. The conductive lining 136 is relatively thin, having a thickness of typically about 2 µm to 50 µm. Conductive lining 136 electrically connects to contact pads 98 by way of conductive layer 118.

An organic material 138 is deposited over conductive lining 136 using spin coating, needle dispensing, or other suitable application process to completely fill the remaining area of notch 114 up to the top of the semiconductor die. Organic material 138 can be BCB, PI, or acrylic resin. Alternatively, other non-conductive materials such as a polymer molding compound, liquid epoxy molding, compression molding, soft laminating film, or other material having dielectric or electrical insulating properties can be laid over conductive lining 136.

The assembly is inverted and attached to a carrier, as described in FIG. 3e. A notch like 122 is cut into organic material 112. The walls of the remaining portion of organic material 112, which define notch 122, can be vertical or tapered. An electrically conductive lining 140 is conformally deposited along the walls of the remaining portion of organic material 112 in notch 122. Conductive lining 140 includes an optional seed layer. The seed layer and conductive lining 136 are patterned and deposited using a conformal electrolytic plating, electroless plating, or other suitable metal deposition process. The seed layer can be made with Cu, Ni, NiV, Au, or Al. The conductive lining 140 can be made with Al, Cu, Sn, Ni, Au, or Ag. The conductive lining 140 is relatively thin, having a thickness of typically about 2 μm to 50 μm.

An organic material 142 is deposited over conductive lining 140 using spin coating, needle dispensing, or other suitable application process to completely fill the remaining area of notch 122 up to the top of the semiconductor die. Organic material 142 can be BCB, PI, or acrylic resin. Alternatively, other non-conductive materials such as a polymer molding compound, liquid epoxy molding, compression molding, soft laminating film, or other material having dielectric or electrical insulating properties can be laid over conductive lining 140.

The semiconductor die are singulated through a center portion of gap 108, i.e., through a center portion of notches 114 and 122 to bisect conductive linings 136 and 140 and create a conductive half-via. The saw street or gap region is cut by a cutting tool such as a saw blade or laser. The cutting tool completely severs the gap region to separate the die. The conformal application of the conductive linings 136 and 140 along the walls of organic material 112 defines the conductive half-via within the gap.

Figure 6:
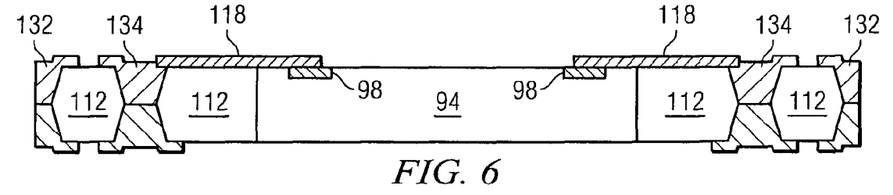
FIG. 6 illustrates the semiconductor die with multiple rows of double-sided conductive full-vias and half-vias.

FIG. 6 illustrates multiple rows of conductive vias formed in gap 108. In this case, semiconductor die 94 has full-vias 134 and half-vias 132. However, it's understood that the number and the type of vias are not limited to the embodiment of FIG. 6. The manufacturing process follows a similar discussion as provided for FIGS. 3a-3i and 4. The multiple rows of conductive vias can also use the conductive via structure shown in FIG. 5.

Figure 7:
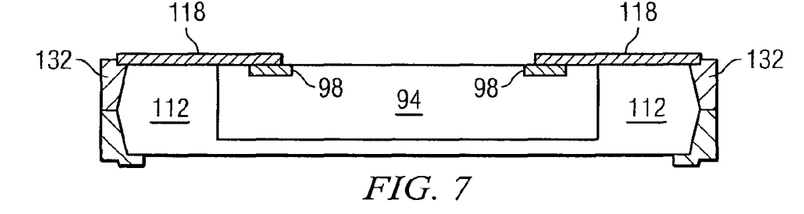
FIG. 7 illustrates the semiconductor die with double-sided conductive half-vias and organic material disposed under the die.

FIG. 7 shows semiconductor die 94 with conductive half-vias 132. Organic material 112 is deposited on the sides and bottom of semiconductor die 94. In this embodiment, the backside of semiconductor die 94 is vertically offset from the bottom of conductive vias 132 so that organic material 112 can be deposited on the backside of semiconductor die 94.

Figure 8:
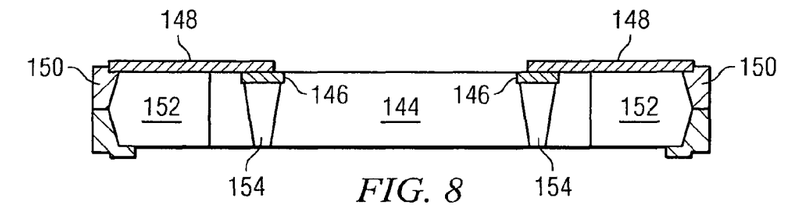
FIG. 8 illustrates the semiconductor die with double-sided conductive half-vias and conductive vias formed under the contact pads of the die.

FIG. 8 shows semiconductor die 144 with contact pads 146 and conductive layers 148 electrically connecting contact pads 146 to conductive half-vias 150. Conductive half-vias 150 are formed in organic material 152 as described above. In this case, vias 154 are formed under contact pads 146 and filled with conductive material for additional interconnect structure.

Figure 9A:
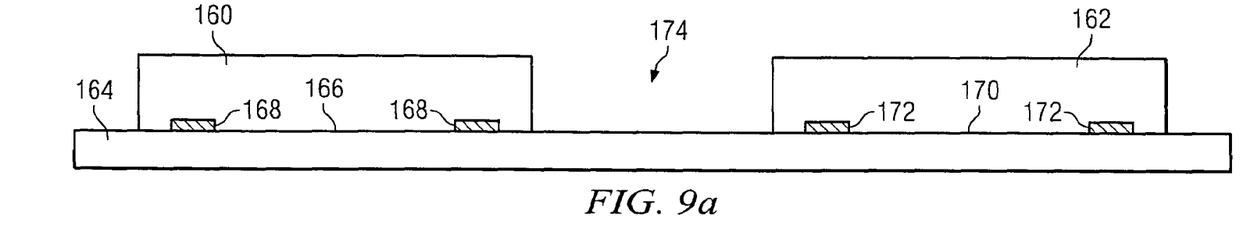
FIGS. 9a-9h illustrate an alternate process of forming double-sided conductive vias in the saw street around a periphery of the die.

An alternate embodiment of forming double-sided conductive vias is shown in FIGS. 9a-9h. The semiconductor wafer, containing semiconductor die 160 and 162, is mounted to expansion table 164 with ultraviolet (UV) tape, as shown in FIG. 9a. The front of semiconductor die 160 is affixed to expansion table 164 with its active surface 166 and contact pads 168 oriented face down. Likewise, the front of semiconductor die 162 is mounted to expansion table 164 with its active surface 170 and contact pads 172 oriented face down. Contact pads 168 and 172 electrically connect to active and passive devices and signal traces in active areas 166 and 170 of semiconductor die 160 and 162, respectively.

A saw blade or laser tool cuts through saw street 174 between semiconductor die 160 and 162 in a dicing operation. Expansion table 164 moves in the lateral direction to expand the width of saw street 174, i.e., form a gap to create a greater physical separation between the die. The post-expansion width of saw street or gap 174 ranges from 5 μm to 200 μm. The expanded dimension depends on the design embodiment, i.e., half-via, full-via, single row via, or double/multiple row via. The expanded saw street or gap 174 defines a peripheral region around the semiconductor die.

Figure 9B:
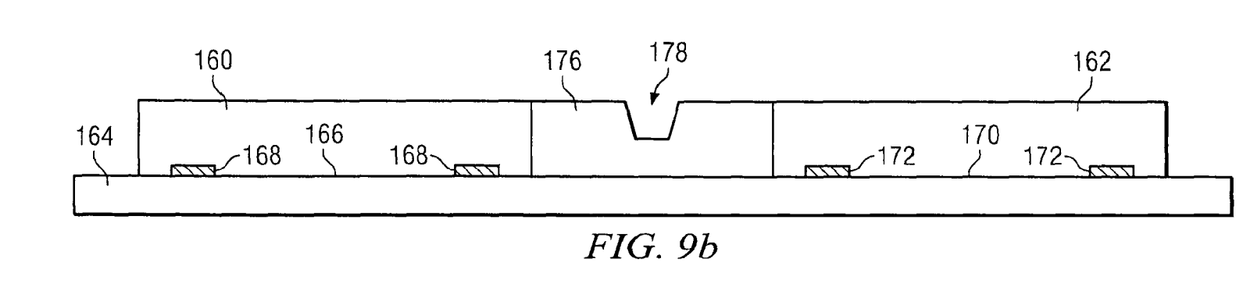

In FIG. 9b, an organic material 176 is deposited in gap 174 using spin coating, needle dispensing, or other suitable application process. Organic material 176 can be BCB, PI, or acrylic resin. Alternatively, other non-conductive materials such as a polymer molding compound, liquid epoxy molding, compression molding, soft laminating film, or other material having dielectric or electrical insulating properties can be deposited in gap 174. The non-conductive materials can also be deposited using a transfer molding or injection molding process.

A portion of organic material 176 is removed from a first side of the semiconductor wafer by laser drilling or etching to create blind hole or notch 178 having a depth less than a thickness of semiconductor die 160 and 162. In one embodiment, notch 178 extends about halfway through the organic material. The walls of the remaining portion of organic material 176, which define notch 178, can be vertical or tapered.

Figure 9C:
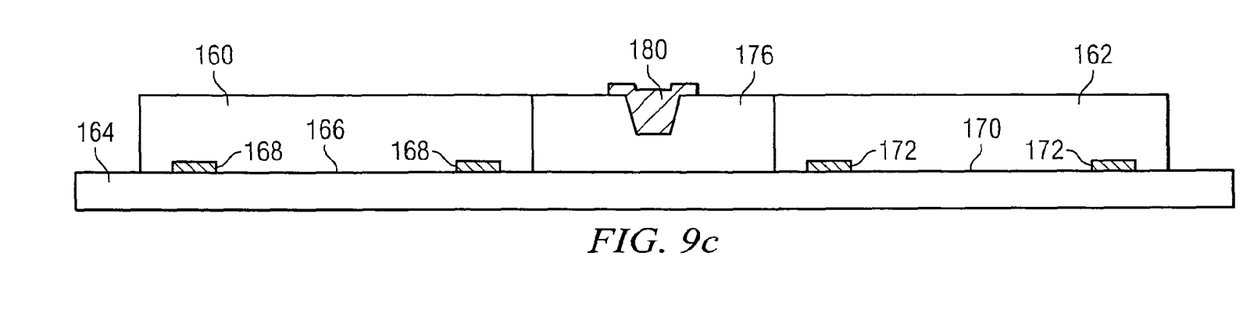

In FIG. 9c, an electrically conductive material 180 is conformally deposited in notch 178 with an optional seed layer. Conductive material 180 can be Al, Cu, Sn, Ni, Au, or Ag. The seed layer can be made with Cu, Ni, NiV, Au, or Al. The seed layer and conductive material 180 are patterned and deposited using a conformal electrolytic plating, electroless plating, or other suitable metal deposition process.

Figure 9D:
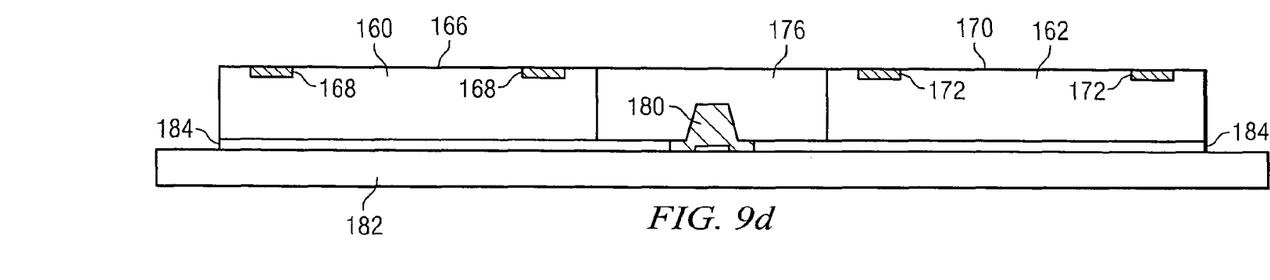

The assembly described in FIGS. 9a-9c is removed from expansion table 164. In FIG. 9d, the assembly is inverted and mounted active surface up on carrier 182 using adhesive 184, such as a thermal epoxy material.

Figure 9E:
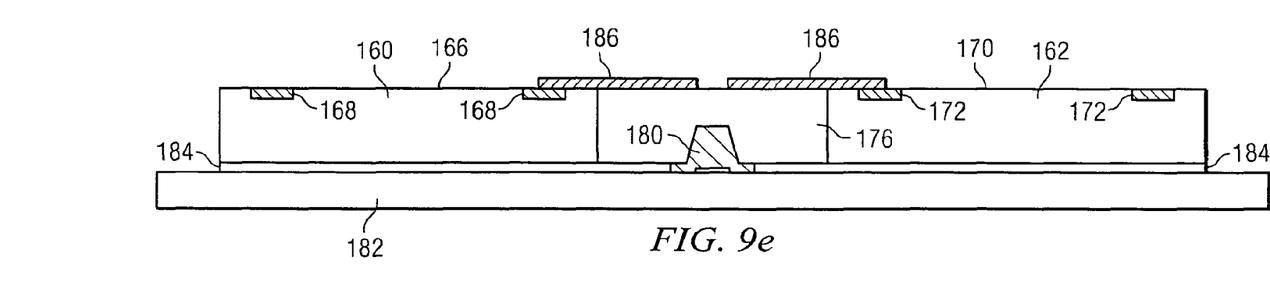

In FIG. 9e, an electrically conductive material 186 is patterned and deposited on active surface 166 of semiconductor die 160 and active surface 170 of semiconductor die 162, as well as organic layer 176, using an evaporation, electrolytic plating, electroless plating, screen printing, or other suitable metal deposition process. The conductive layer 186 can be made with Al, Cu, Sn, Ni, Au, Ag, or other suitable material.

Figure 9F:
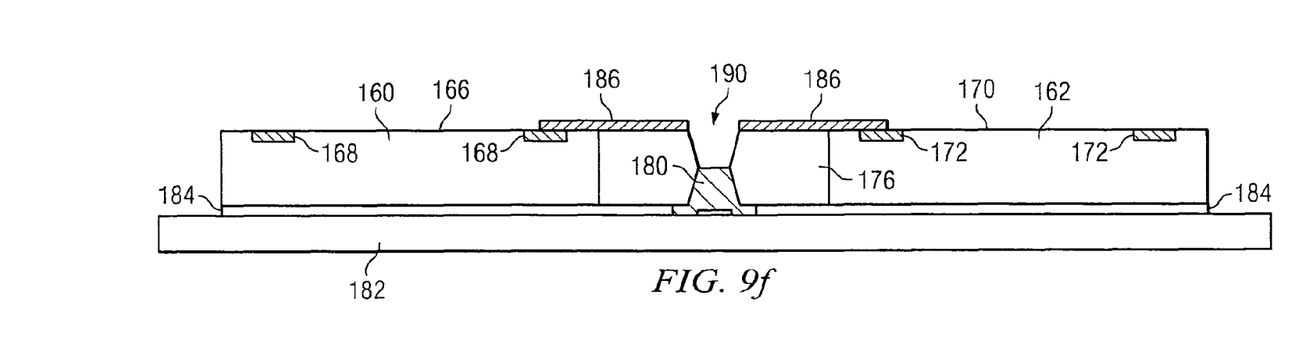

Another portion of organic material 176 is removed from a second side of the semiconductor wafer opposite the first side of the semiconductor wafer, i.e., directly opposite notch 178, by laser drilling or etching to create blind hole or notch 190 extending through the organic material to conductive material 180, as shown in FIG. 9f. The walls of the remaining portion of organic material 176, which define notch 190, can be vertical or tapered.

Figure 9G:
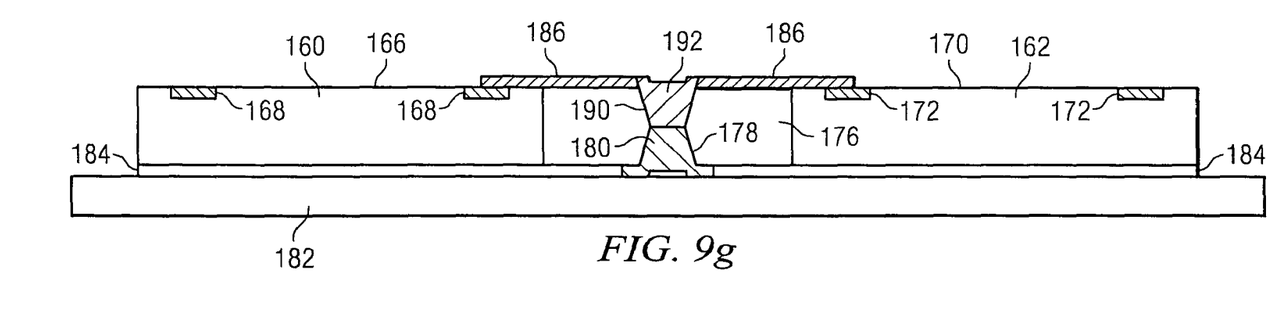

In FIG. 9g, an electrically conductive material 192 is conformally deposited in notch 190 with an optional seed layer. Conductive material 192 can be Al, Cu, Sn, Ni, Au, or Ag. The seed layer can be made with Cu, Ni, NiV, Au, or Al. The seed layer and conductive material 192 are patterned and deposited using a conformal electrolytic plating, electroless plating, or other suitable metal deposition process. Conductive material 192 electrically connects to conductive material 180. The conductive layer 186 extends from contact pads 168 and 172 to conductive material 192. The combination of conductive materials 180 and 192 constitute a double-sided conductive via formed through expanded gap 174 in organic material 176 around a peripheral region of the semiconductor die. The double-sided conductive via extends through the semiconductor wafer and creates a signal conduction path from one side of the semiconductor die to the other side of the semiconductor die.

Figure 9H:
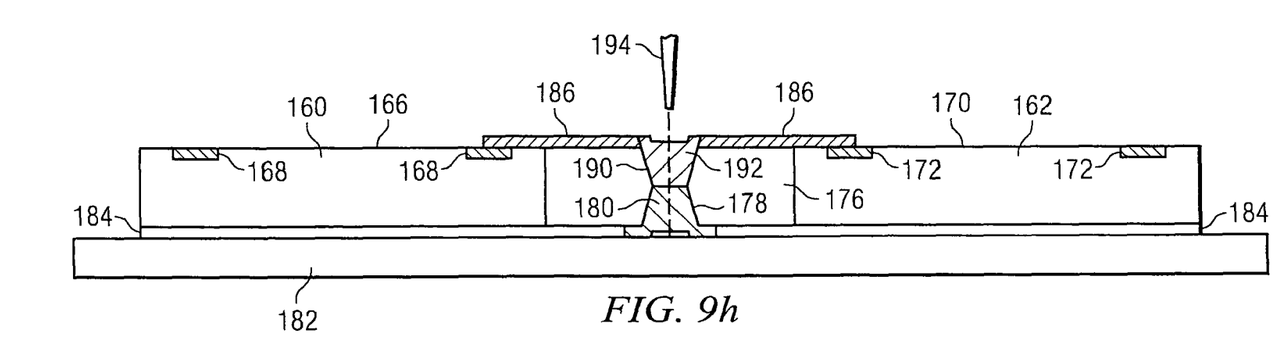

Semiconductor die 160 and 162 are singulated in FIG. 9h through a center portion of gap 174, i.e., through a center portion of the notches 178 and 190 to bisect conductive materials 180 and 192 and create conductive half-vias. The saw street or gap region is cut by a cutting tool 194 such as a saw blade or laser. The cutting tool completely severs the gap region to separate the die. The semiconductor die are removed from carrier 182. Each semiconductor die has a similar final configuration.

Figure 10:
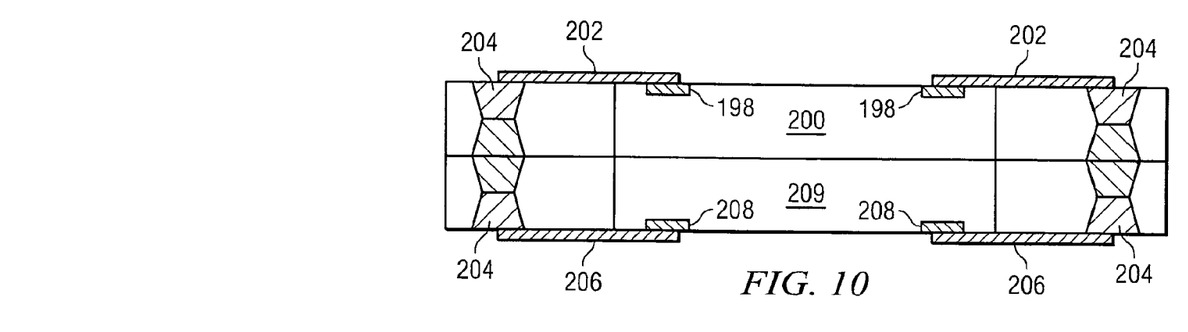
FIG. 10 illustrates a plurality of stacked semiconductor die interconnected by double-sided conductive full-vias.

FIG. 10 illustrates two stacked semiconductor die similar to FIG. 4 electrically interconnected with conductive full-vias. Contact pads 198 of semiconductor die 200 electrically connect through conductive layer 202 to conductive full-vias 204, which in turn electrically connect through conductive layer 206 to contact pads 208 of semiconductor die 209.

Figure 11:
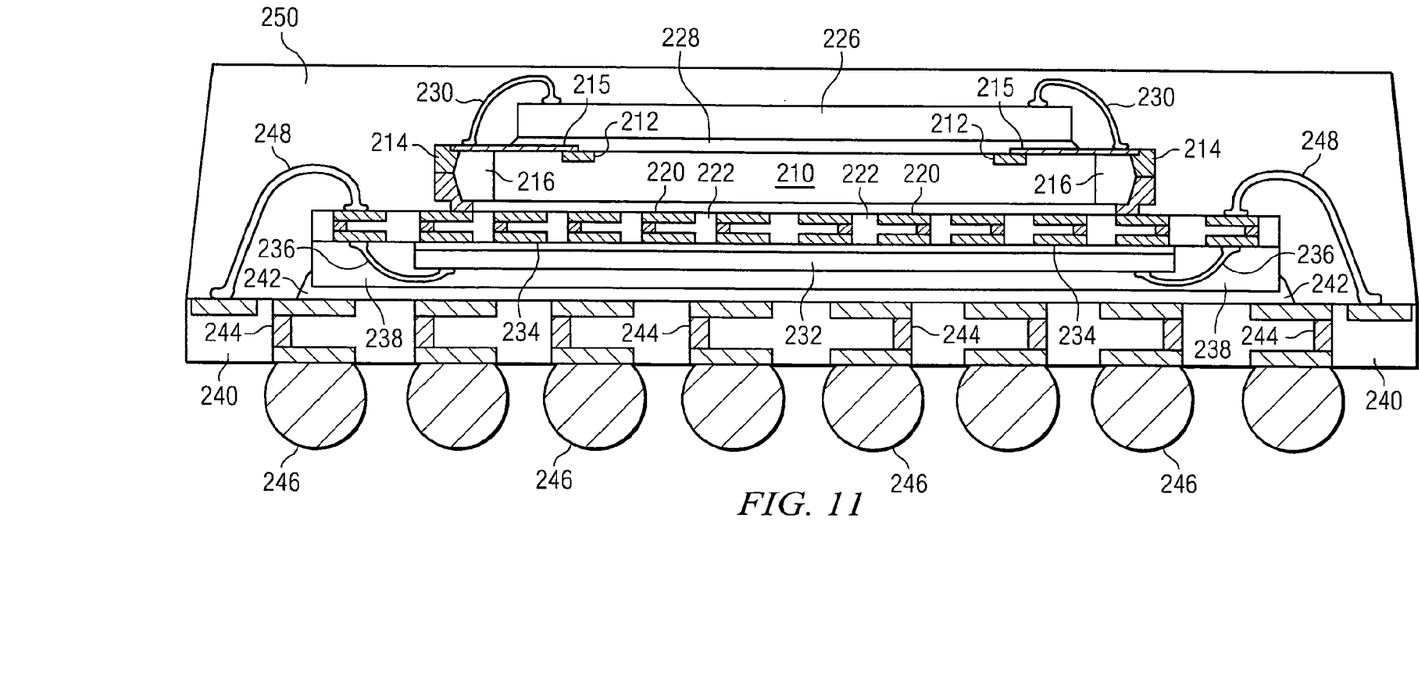
FIG. 11 illustrates a package-in-package with semiconductor die interconnected by conformal conductive vias formed in the saw street.

The aforedescribed semiconductor die with double-sided conductive vias formed along the gap can be readily integrated into a package-in-package (PiP) applications, as shown in FIG. 11. Semiconductor device 210 has contact pads 212. Contact pads 212 connect to conductive half-vias 214 by way of conductive layer 215. Conductive vias 214 are separated from device 210 by insulating material 216 in the gap of semiconductor die 210. Conductive vias 214 further connect to interconnect structure 220 on substrate 222. Semiconductor device 226 is mounted to semiconductor die 210 using adhesive layer 228. Semiconductor device 226 electrically connects to conductive vias 214 with bond wires 230. Semiconductor device 232 is mounted to a backside of substrate 222 using adhesive layer 234. Semiconductor device 232 electrically connects to interconnect structure 220 with bond wires 236. A molding compound or encapsulant 238 is deposited over semiconductor device 232 and bond wires 236. Molding compound 238 can be made with epoxy acrylate or other polymer material and applied by transfer molding, liquid encapsulant molding, or other molding process. Molding compound 238 is non-conductive and environmentally protects the semiconductor device from external elements and contaminants. In one embodiment, semiconductor devices 210, 226, and 232 are stacked memory devices.

The entire assembly 210-238 is mounted to substrate 240 with adhesive layer 242. An electrically conductive solder material is deposited over interconnect structure 244 on substrate 240 using an evaporation, electrolytic plating, electroless plating, ball drop, or screen printing process. The solder material can be any metal or electrically conductive material, e.g., Sn, Pb, Ni, Au, Ag, Cu, Bi, and alloys thereof. For example, the solder material can be eutectic Sn/Pb, high lead, or lead free. The solder material is ref lowed by heating the solder material above its melting point to form solder bumps 246. In some applications, solder bumps 246 are ref lowed a second time to improve electrical contact to interconnect structure 244. Bond wires 248 electrically connect interconnect structure 220 on substrate 222 with interconnect structure 244 on substrate 240. An encapsulant or molding compound 250 is formed over semiconductor devices 210 and 226, substrates 222 and 240, and bond wires 230 and 248. Conductive vias 214 performs an integrated part of the electrical interconnection between stacked semiconductor devices 210, 226, and 232 in the PiP.

The semiconductor die with double-sided conductive vias formed along the gap can also be integrated into a fan-in package-on-package (Fi-PoP) applications.

The above described formation of double-sided conductive vias achieves a high aspect ratio and no voids within the via. The conductive vias are double-sided in that a first portion is formed from a first side of the semiconductor wafer and a second portion is formed from a second side of the semiconductor wafer, opposite the first side of the wafer. The first and second portions of the conductive vias are electrically mated to provide a signal conduction path from one side of the semiconductor die to the other side of the semiconductor die. The double-sided conductive vias provide for efficient and compact electrical interconnect by direct via metal bonding when stacking semiconductor die within a semiconductor package. The double-sided conductive vias provide a double aspect ratio which reduces via pitch and increases via density, allowing the total semiconductor package size to be reduced.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a semiconductor die having a contact pad formed over the semiconductor die;
   an insulating material formed in a peripheral region around the semiconductor die, wherein the insulating material includes a first notch formed from a first surface of the insulating material through a first portion of the insulating material that is less than a thickness of the insulating material and a second notch formed from a second surface of the insulating material opposite the first surface through a second portion of the insulating material;
   a conductive via formed through the insulating material around the semiconductor die, the conductive via including,
   (a) a first conductive material deposited into the first notch to form a first portion of the conductive via in the insulating material, and
   (b) a second conductive material deposited into the second notch to form a second portion of the conductive via in the insulating material; and
   a conductive layer formed over the semiconductor die and insulating layer between the contact pad and conductive via.

2. The semiconductor device of claim 1, wherein the conductive via is tapered or vertical.

3. The semiconductor device of claim 1, further including a conductive lining formed in the first and second notches, wherein the first and second conductive material conforms to the conductive lining in the first and second notches.

4. The semiconductor device of claim 1, wherein the conductive via is singulated to form a conductive half via.

5. The semiconductor device of claim 1, further including a plurality of stacked semiconductor die electrically interconnected through the conductive vias.

6. The semiconductor device of claim 1, wherein the insulating material is deposited under the semiconductor die.

7. The semiconductor device of claim 1, further including a through silicon via formed under the contact pad.

8. A semiconductor device, comprising:
   a semiconductor die;
   an insulating material deposited in a peripheral region around the semiconductor die; and
   a double-sided conductive via formed in the insulating material in the peripheral region, the double-sided conductive via having first and second portions formed through opposite surfaces of the insulating material.

9. The semiconductor device of claim 8, wherein the double-sided conductive via is tapered or vertical.

10. The semiconductor device of claim 8, further including a plurality of rows of double-sided conductive vias formed in the peripheral region.

11. The semiconductor device of claim 8, wherein the double-sided conductive via is electrically connected to a contact pad on the semiconductor die.

12. The semiconductor device of claim 8, further including a plurality of stacked semiconductor devices electrically interconnected by the double-sided conductive via.

* * * * *